United States Patent
Kulkarni et al.

(10) Patent No.: US 8,632,745 B1
(45) Date of Patent: Jan. 21, 2014

(54) METHOD AND APPARATUS FOR CONTROLLING STOICHIOMETRY IN MULTICOMPONENT MATERIALS

(71) Applicant: UT-Battelle, LLC, Oak Ridge, TN (US)

(72) Inventors: Nagraj Sheshgiri Kulkarni, Knoxville, TN (US); Miroslaw Stefan Gruszkiewicz, Knoxville, TN (US); Boyd Mccutchen Evans, III, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/724,489

(22) Filed: Dec. 21, 2012

(51) Int. Cl.
| | |
|---|---|
| B01J 19/00 | (2006.01) |
| C01B 17/00 | (2006.01) |
| C01B 19/00 | (2006.01) |
| H01B 1/06 | (2006.01) |
| H01B 1/10 | (2006.01) |
| H01L 25/00 | (2006.01) |
| H01L 31/00 | (2006.01) |

(52) U.S. Cl.
USPC ........ 423/508; 423/511; 252/519.4; 422/119; 422/129; 422/187; 422/198; 422/600; 136/243; 136/252; 136/264

(58) Field of Classification Search
USPC ........ 423/508, 511; 252/519.4; 422/129, 187, 422/600, 198, 119; 136/243, 252, 264
See application file for complete search history.

(56) References Cited

U.S. PATENT DOCUMENTS

| | | | |
|---|---|---|---|
| 5,047,385 A | 9/1991 | Beasley et al. | ...... 505/1 |
| 5,204,318 A | 4/1993 | Yurek et al. | ...... 505/1 |
| 2009/0181179 A1 | 7/2009 | Goel et al. | ...... 427/455 |
| 2010/0224245 A1 | 9/2010 | Bartholomeusz et al. | .... 136/256 |
| 2011/0067757 A1 | 3/2011 | Frantz et al. | ...... 136/258 |
| 2011/0147208 A1 | 6/2011 | Goel et al. | ...... 204/298.13 |

(Continued)

FOREIGN PATENT DOCUMENTS

| | | | | |
|---|---|---|---|---|
| CN | 101640265 B | 9/2011 | | H01M 4/04 |
| JP | 11335831 | 12/1999 | | C23C 14/40 |
| JP | 2008502805 | 1/2008 | | C23C 16/42 |
| WO | WO 2011/070398 A1 | 6/2011 | | H01L 21/28 |

OTHER PUBLICATIONS

Gruszkiewicz, Miroslaw S. et al., "Phase Behavior of Aqueous Na—K—Mg—Ca—Cl—$NO_3$ Mixtures: Isopiestic Measurements and Thermodynamic Modeling," *J Solution Chem.* 36, (2007) pp. 723-765.

(Continued)

*Primary Examiner* — Timothy Vanoy
(74) *Attorney, Agent, or Firm* — Brinks Gilson & Lione

(57) ABSTRACT

A method of controlling stoichiometry in a multicomponent material includes providing a solid sample comprising N elements and having a first composition in a main chamber, which is connected to at most N−1 reservoirs. Each of the reservoirs is configured to contain a vapor comprising one of the N elements, where N≥2. The solid sample is heated to a first temperature in the main chamber, and each of the reservoirs is heated to a first reservoir temperature ($T_1, T_2 \ldots T_{N-1}$) sufficient to achieve a predetermined vapor pressure of the vapor contained therein. The reservoirs are placed in gaseous communication with the main chamber, and thermodynamic equilibrium is achieved between the vapor from each of the reservoirs and the solid sample in the main chamber. Consequently, a stoichiometry of the solid sample is changed to arrive at a second composition thereof.

23 Claims, 4 Drawing Sheets

(56) References Cited

U.S. PATENT DOCUMENTS

| | | | |
|---|---|---|---|
| 2011/0290643 A1 | 12/2011 | Munteanu et al. | 204/298.13 |
| 2012/0073637 A1 | 3/2012 | Fujdala et al. | 136/255 |
| 2012/0073659 A1 | 3/2012 | Fujdala et al. | 136/262 |
| 2012/0295396 A1* | 11/2012 | Teeter et al. | 438/95 |
| 2013/0061903 A1* | 3/2013 | Mitzi et al. | 136/244 |

OTHER PUBLICATIONS

Gruszkiewicz, Miroslaw S. et al., "Vapor Pressures and Isopiestic Molalities of Concentrated $CaCl_2(aq)$, $CaBr_2(aq)$, and NaCl(aq) to $T=523K$," *J. Chem. Thermodynamics* 37 (2005) pp. 906-930.

Kartavtseva, M.S. et al., "Control of the Cation Stoichiometry in the Multiferroic $BiFeO_3$ Thin Films," *Ferroelectrics* 374 (2008) pp. 20-25.

* cited by examiner

US 8,632,745 B1

METHOD AND APPARATUS FOR CONTROLLING STOICHIOMETRY IN MULTICOMPONENT MATERIALS

TECHNICAL FIELD

The present disclosure is related generally to the materials processing and more particularly to a method to control the stoichiometry of multicomponent materials, such as photovoltaic absorber materials.

BACKGROUND

The large-scale implementation of photovoltaic (PV) energy production could benefit from the use of non-toxic, earth-abundant materials that lend themselves to high-volume manufacturing processes. Sulfides based on Cu, Zn, and Sn provide interesting possibilities as inexpensive thin-film PV absorber materials, since their optical properties (band gaps, carrier mobilities, absorption coefficients) can be tuned by forming ternary and quaternary sulfide compounds. For example, the quaternary sulfide $Cu_2ZnSnS_4$ (CZTS) or selenide $Cu_2ZnSnSe_4$ (CZTSe) or sulfide-selenide $Cu_2ZnSn(S,Se)_4$ (CZTSSe) are relatively new, thin-film solar cell absorber materials with a theoretical single-junction energy conversion efficiency limit of about 30% due to their optimal band gaps (~1.5 eV) and a high absorption coefficients (>$10^4$ $cm^{-1}$). Also, the raw materials needed to fabricate CZTS or CZTSSe are relatively low-cost and produced in the US, in contrast to those used for current commercial non-silicon, thin film PV modules (e.g., Te in CdTe and In and Ga in CIGS). Despite the very high theoretical efficiency (over 30%) of CZTS or CZTSe, the best efficiencies achieved in the laboratory to date have not exceeded ~11% (CZTS~8.5%, CZTSe~9.15%, CZTSSe~11.1%). The binary sulfides, e.g., $Cu_2S$ and SnS, are also of interest as even cheaper PV absorber materials with theoretical efficiencies near 25%.

A major problem in sulfide PV materials is that high temperature annealing treatments are often employed to obtain large grain sizes in order to minimize recombination losses at grain boundaries, and these treatments may lead to vapor-phase loss of volatile species (e.g., S and Sn in CZTS) and thus stoichiometry changes and phase separation.

A challenge in the development of PV thin film compounds based on sulfides is that the ideal stoichiometry suitable for the best PV properties may not be known and further cannot be controlled uniformly across a large-area thin film. In stoichiometric materials, minor deviations from stoichiometry can easily result in very large changes in the thermodynamic chemical potentials of the components and hence the physical/optical properties of the material.

BRIEF SUMMARY

A novel method and apparatus for controlling stoichiometry in multicomponent materials are described. The inventive technology may enable the fabrication of large-area photovoltaic absorber films that have excellent optical properties and compositional uniformity across and throughout the entire film.

The method includes providing a solid sample comprising N elements and having a first composition in a main chamber, which is connected to at most N–1 reservoirs. Each of the at most N–1 reservoirs is configured to contain a vapor comprising one of the N elements, where N≥2. The solid sample is uniformly heated to a first temperature in the main chamber, and each of the reservoirs is heated to a first reservoir temperature ($T_1, T_2 \ldots T_{N-1}$) sufficient to achieve a predetermined vapor pressure of the vapor contained therein. The reservoirs are placed in gaseous communication with the main chamber, and thermodynamic equilibrium is achieved between the vapor from each of the reservoirs and the solid sample in the main chamber. Consequently, a stoichiometry of the solid sample is changed to arrive at a second composition thereof.

The apparatus includes a main chamber defining an enclosed space therein and comprising a heat source for uniform heating of a solid sample comprising N elements, where N≥2. The apparatus also includes at most N–1 temperature-controlled reservoirs connected to the main chamber, where each of the temperature-controlled reservoirs is configured to contain a vapor comprising one of the N elements at a desired vapor pressure.

DETAILED DESCRIPTION

An "isopiestic" manufacturing technique based on material thermodynamics that allows for compositional control of thin-film materials over large areas is described herein. This thermodynamic-based manufacturing technique is broadly applicable to a wide range of materials and may permit correlations between composition, defect chemistry, and optical and other properties to be obtained.

For example, the thermodynamic equilibration of volatile elements (Sn, Zn, S) of the quaternary Cu—Zn—Sn—S system at various temperatures may be employed to selectively and uniformly manipulate the stoichiometry of $Cu_2ZnSnS_4$ (CZTS). The chemical potentials of the elements may then be correlated with the optical properties of the thermodynamically-equilibrated samples to obtain, for example, optimal absorber compositions/stoichiometries for high efficiency thin-film photovoltaic (PV) cells.

A basic principle of the isopiestic technique is that if one of the elemental components in a solution (solid or liquid) has a much higher activity/vapor pressure than the other elemental component (assuming a binary system), then the activity or chemical potential of the more volatile component in the solution phase can be controlled by thermodynamic equilibration with a reservoir containing the pure volatile component that is maintained at a known, fixed vapor pressure. Thermodynamic equilibrium may be established between the reservoir and the sample via transfer of the volatile component through the gas phase. The same principle may be applied to ternary or higher order systems, where additional vapor-containing reservoirs may be employed to achieve thermodynamic equilibrium. Since the vapor pressures of pure elements are known as a function of temperature, accurate control of the temperature of the pure element in the reservoir (solid or liquid) establishes the vapor pressure over the sample, and thus the activity of that element in the sample, which may be maintained at a different temperature from that of the reservoir. The vapor pressure of compounds or alloys (which include two or more elemental components) may also be known as a function of temperature; accordingly, the reservoir may contain a compound or alloy instead of a pure element. The use of a suitably large reservoir or a means of replenishing the reservoir can be employed in the situation where one of the components of the compound or alloy volatilizes more rapidly than the other(s) at a given temperature.

Figure 1:
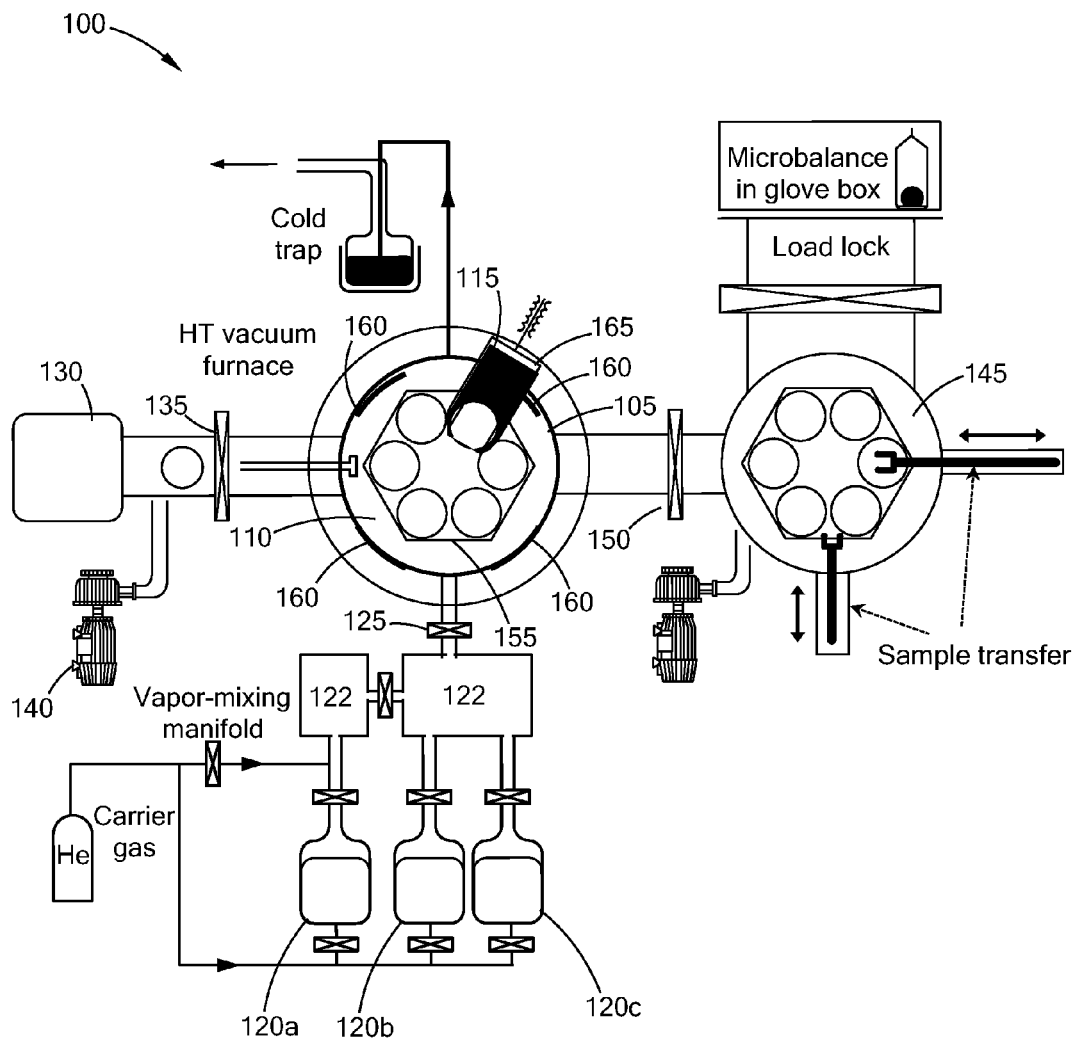
FIG. 1 is a schematic of an exemplary isopiestic system.

FIG. 1 shows an exemplary isopiestic system for controlling chemical potentials and hence stoichiometry of multicomponent samples, such as for example, sulfide compounds. The apparatus 100 includes a main chamber 105 comprising a heat source and defining an enclosed space 110 therein for uniform heating of a solid sample comprising N elements, where N≥2 or preferably N≥3. In this example, N=4. In general, N may range from 2 to 8, or more typically from 3 to 6. Advantageously, the main chamber 105 can be uniformly heated to various temperatures, e.g, a temperature of about 800° C. or higher, or 500° C. or higher, or 300° C. or higher, or 150° C. or higher, or 50° C. or higher. A heating jacket 165 is shown as the heat source in FIG. 1, although other heating methods may be employed to uniformly heat the main chamber 105, as discussed further below.

The apparatus 100 further includes at most N−1 temperature-controlled reservoirs 120a, 120b, 120c connected to the main chamber 105 by a valve 125 (e.g., a gate valve). There may be N−1 temperature-controlled reservoirs or a smaller number of temperature-controlled reservoirs; for example, if more than one of the N elements has a low vapor pressure (in comparison with the vapor pressures of the other elements of the solid sample) at the temperature employed for heating, then there may be N−2 or N−3 temperature controlled reservoirs. Each of the temperature-controlled reservoirs 120a, 120b, 120c is configured to contain a vapor comprising one of the N elements at a desired vapor pressure. One or more mixing volumes 122 may be situated between the reservoirs 120a, 120b, 120c and the valve 125 for mixing of the vapors prior to entry into the main chamber 105.

The term "uniformly heated" or "uniform temperature," when used in reference to a component, environment, or surface heated to a desired temperature, means that the component, environment, or surface exhibits a spatial variation in the desired temperature of about ±2° C. or less. Preferably, the spatial variation is about ±1° C. or less, or about ±0.5° C. or less, and it may be possible to achieve a spatial variation of about ±0.1° C. or less in the desired temperature.

In the case of the solid sample, such high temperature uniformity may achieved by placing the sample on a thermally conductive block in conjunction with uniformly heating the main chamber. It is important that the solid sample have a uniform temperature during the isopiestic process so that the resulting sample composition may be tightly controlled and highly spatially uniform. When more than one solid sample is present in the main chamber, it is advantageous for all of the solid samples to have a uniform temperature and further to be at the same temperature.

The apparatus 100 may further include a microbalance 115 (e.g., a magnetically coupled microbalance) within the main chamber for in-situ gravimetric monitoring of the solid sample. Alternatively, a microbalance may be located outside of the enclosed space to provide weight measurements ex-situ. A mass spectrometer 130 may be connected to the main chamber 105 by a valve 135 for monitoring of vapor phase constituents, and a vacuum pump 140, also connected to the main chamber 105 by a valve (e.g., valve 135 in FIG. 1), may be employed for evacuating the enclosed space 110. The main chamber 105 may include a sample holder 155 configured to hold a plurality of solid samples in the enclosed space 110, and a sample holding and transfer system 145 may be connected to the main chamber 105 (e.g., by a valve 150) for insertion and removal of the solid sample. The sample holding and transfer system 145 may include rotating sample holders configured to contain multiple (e.g., six) samples. The main chamber 105 may further include at least one viewing window 160) (e.g., four evenly spaced windows 160 are shown FIG. 1) for line-of-sight access to the samples, which may be moved into a viewing position for characterization using the rotating sample holder 155. The heat jacket 165 surrounding the main chamber 105 may be configured to include openings for the viewing windows 160.

One of the advantages of the isopiestic system is the ability to equilibrate a number of samples with different compositions (e.g., Sn—S, Cu—S, CZTS) simultaneously until the vapor pressures (and hence chemical potentials) of the volatile components in the solid are equal. The isopiestic approach can also facilitate fabrication of large-area samples having excellent compositional uniformity across and through the entire sample.

A method of controlling stoichiometry in a multicomponent compound includes providing a solid sample comprising N elements and having a first composition in a main chamber, where N≥2 and preferably N≥3. The main chamber is connected to at most N−1 reservoirs, where each of the reservoirs includes a vapor comprising one of the N elements. The solid sample is heated to a first temperature in the main chamber, and each of the reservoirs is heated to a first reservoir temperature ($T_1, T_2 \ldots T_{N-1}$) sufficient to achieve a predetermined vapor pressure of the vapor contained therein. At most, N−1 of the N elements may be considered to be volatile elements, meaning that, of the N elements, they have the highest vapor pressures at the temperature ("the first temperature") to which the solid sample is uniformly heated. The reservoirs are placed in gaseous communication with the main chamber, and vapor phase transfer of the volatile elements to or from the solid sample occurs at the first temperature. Accurate control over the temperature of the elements (in solid or liquid form) in the reservoirs establishes the vapor pressure of each element over the solid sample, and thus the activity of each element in the solid sample. (See "Theoretical Considerations" below.) Thermodynamic equilibrium between the vapor from each of the reservoirs and the solid sample in the main chamber is achieved, and the stoichiometry of the solid sample is changed from the first composition to arrive at a second composition thereof. The solid sample may have excellent compositional homogeneity across and through the entirety of the sample due to the uniform temperature achieved in the main chamber and throughout the solid sample.

It should be noted that when a solid sample is described as having a particular composition (e.g., a first or second composition) in the present disclosure, it is understood that the composition referred to is an average composition determined over an area or volume of the sample. An advantage of the isopiestic method is that the second composition of the solid sample achieved after thermodynamic equilibration has a higher uniformity than the first composition. In other words, deviations from the average composition across and/or through the solid sample are diminished as a consequence of the equilibration. In addition, it is conceivable that in some cases the average composition is unchanged during the isopiestic process; in other words, the second composition may be substantially the same as the first composition, where the discernible change is an improvement in the compositional uniformity of the solid sample.

Typically, the solid sample is a thin film having a thickness of about 5 microns or less. The thickness may also be about 1 micron or less but is typically greater than about 0.01 micron (10 nm). The solid sample may extend over a large area (e.g., from a few square millimeters to several square meters) with compositional uniformity across substantially the entire area after the isopiestic equilibration. In some embodiments, the sample may include at least four elements (N≥4) elements, such as, for example, sulfur, copper, tin, and zinc. The solid sample may be a sulfide, such as stoichiometric or off-stoichiometric CZTS.

The heating of the reservoirs may be carried out under non-isothermal conditions, where at least one (or each) of the first reservoir temperatures ($T_1, T_2 \ldots T_{N-1}$) is different from the first temperature of the solid sample. Alternatively, the heating of the solid sample and the heating of the reservoirs may be carried out under isothermal conditions where each of the first reservoir temperatures ($T_1, T_2 \ldots T_{N-1}$) is the same as the first temperature.

After achieving thermodynamic equilibrium, the solid sample may be weighed to determine any weight change (increase or decrease) that occurred as a consequence of the thermodynamic equilibration. The weighing of the solid sample may be carried out in situ or ex situ with an electromagnetic weighing balance or another microbalance. For example, magnetic suspension balances that are commercially available from Rubotherm GmbH of Bochum, Germany may be suitable for in situ weight measurements. From the weight change, it may be possible to determine the change in composition of the solid sample. In the case of multi-element samples, weight change measurements can be used to determine the change in composition provided only a single volatile element is being equilibrated in the isopiestic system. Even if weight change measurements are not sufficient to determine the change in composition of the solid sample, the measurements can confirm that the equilibration process is complete. One or more of the properties (e.g., optical, electronic, mechanical, or other properties) as well as microstructural or chemical characteristics/changes may be determined after the equilibration.

If there are multiple volatile elements present in the solid sample, then the change in composition may be verified using a technique other than weight change measurements, either in-situ or outside the main chamber. To facilitate in-situ analysis, the main chamber may include one or more viewing windows positioned and sized so as to allow line-of-sight access to one or more solid samples in the main chamber. Characterization methods such as x-ray photoelectron spectroscopy, auger electron spectroscopy, x-ray fluorescence, or Rutherford backscattering may be employed for in-situ composition measurements by accessing the solid sample(s) via one or more of the viewing windows. For example, the chamber may include two or more, three or more, or four or more viewing windows. Referring again to FIG. 1, four to six windows 160 evenly spaced about the circumference of the main chamber 105 may be particularly advantageous for viewing the solid samples, which may be moved into a viewing position for characterization using a rotating sample holder 155. In addition, one or more in-situ process monitors, e.g., optical, infrared, x-ray, ellipsometry, etc., may be employed with the apparatus depending upon the particular application.

It is also contemplated that the load-lock capability of the apparatus may be exploited to remove a specimen from the main chamber without disturbing the processing environment in order to measure the solid sample composition (or another characteristic or property) externally. After testing, the solid sample may be returned to the chamber for further processing. For example, the main chamber may include several wafers of differing compositions (where each wafer may include multiple samples of the same composition), and, after equilibration, one of the samples may be removed from each wafer for external measurements (and optionally returned to the main chamber afterward), while the others remain for further processing. The conditions in the main chamber need not be altered during the removal and optional return of the sample(s).

The method may further comprise optimizing the stoichiometry of the solid sample, where, after determining the weight change and composition change of the equilibrated sample (and optionally evaluating one or more properties of the solid sample) the method is repeated with one or more of the reservoirs being heated to a different temperature and with the equilibration being carried out at the different temperature for a specified time. This approach may be employed to further modify the composition and the properties of the solid sample.

For example, to carry out the optimization, the second composition resulting from the first equilibration may be considered to be a first tuned composition, and each of the reservoirs may be heated to a second reservoir temperature sufficient to achieve a given vapor pressure of the vapor contained in each reservoir, while the solid sample is heated in the main chamber to a second temperature, which may be different from or the same as the first temperature. The reservoirs are placed in gaseous communication with the main chamber, and thermodynamic equilibrium is achieved between each of the reservoirs and the solid sample in the main chamber, as described above. Consequently, the stoichiometry of the solid sample comprising the first tuned composition is changed such that the solid sample achieves a second tuned composition. The weight change of the solid sample having the second tuned composition may be determined as a means of quantifying the change in stoichiometry after achieving thermal equilibrium, and one or more properties of the equilibrated sample may be evaluated. The optimization of the stoichiometry of the solid sample may be carried out multiple times to arrive at an $n^{th}$ tuned composition (which may be the optimal composition or stoichiometry) of the solid sample, where n is greater than or equal to 2 and may be as high as 10, for example. Based on this approach, a thermodynamic model may be developed linking vapor pressures of the elements to the composition and properties of the isopiestically-processed solid sample. The property or properties measured for the sample after each equilibration may determine which tuned composition is the optimal composition.

Ultimately, once the optimal stoichiometry is obtained for a given solid sample (e.g., a sulfide sample comprising the elements Cu, S, Zn and Sn), the optimized process conditions may be employed to apply the isopiestic technique to large-area solid samples (e.g., large-area thin films) comprising the same elements. For example, large-area sulfide absorber films may be produced and isopiestically processed under optimized process conditions to achieve a desired stoichiometry (and optimal optical properties) for application in photovoltaic cells. The isopiestically processed large-area films may exhibit a uniquely uniform composition across the entire surface of the film, as well as through the thickness.

Prior to carrying out the isopiestic process and achieving thermal equilibrium, the solid sample may be formed on a substrate by a deposition process such as chemical vapor deposition, physical vapor deposition (e.g., sputtering or thermal evaporation), spin coating, dip coating, or another method. It is also contemplated that the deposition process may be carried out simultaneously with the thermal equilibration. Alternatively, the method for preparing a solid sample may involve the initial synthesis of a bulk solid using ingot solidification and processing (rolling, extrusion, forging, etc.), powder metallurgy and other techniques employed for bulk solid synthesis, followed by suitable sectioning of the bulk solid to achieve the required thickness of the solid sample.

Each of the N−1 reservoirs may be controllably heated by any of a number of methods known in the art, such as resistive heating, radiant heating, and/or induction heating with or without a susceptor, or other known heating methods, in order to reach and maintain the desired (e.g., first, second, and/or $n^{th}$) reservoir temperatures. The solid sample in the main chamber may be uniformly heated to the appropriate temperature by uniformly heating the enclosed space within the main chamber. This may be done by, for example, using a quartz tube for the furnace body surrounded by resistive heating coils housed in an outer layer of insulating material (i.e., a heat jacket). In another example, resistive heating elements and/or resistive cartridge heaters may be used inside or outside the furnace. Alternatively, a circulating fluid bath with either resistive heating at a removed location or a radiative (infrared) furnace may be employed.

The N elements may be any elements from the periodic table present in a compound or an alloy that may benefit from the thermal equilibration technique described herein. For example, the N elements may be selected from the group consisting of Al, Cr, Mn, Fe, Co, Cu, Zn, Ga, Ge, Zr, Nb, Mo, Tc, Ru, Rh, Pd, Ag, Cd, In, Sn, Sb, Hf, Ta, Te, Se, W, Re, Os, Ir, Pt, Au, Hg, Tl, Pb, Bi, Po, V, S, Si, and others. According to one embodiment, the N elements include copper (Cu), sulfur (S), tin (Sn), selenium (Se) and zinc (Zn); in another embodiment, the N elements may include Fe, Se, Te, Ca, Sr, Ba; in another embodiment, the N elements may include Mn, Fe, Bi and Sb. Typically, the element present in each reservoir has a high vapor pressure (>$10^{-6}$ Torr) at a temperature <1000° C. For example, see Table 1 below. More typically, the element has a high vapor pressure (>$10^{-6}$ Torr) at a temperature <750° C. or <500° C. In some cases, compounds or alloys of various elements that have high vapor pressures can be utilized to provide the vapors in the reservoirs, e.g., SnS ($10^{-4}$ Torr at ~450° C.), ZnS ($10^{-4}$ Torr at ~800° C.), CdSe ($10^{-4}$ Torr at ~540° C.), $Bi_2Te_3$ ($10^{-4}$ Torr at ~600° C.) and/or several others.

TABLE 1

Reservoir temperatures at which different vapor pressures are achieved for various elements and compounds

| | Temperatures (° C.) for given vapor pressures (Torr) | | |
|---|---|---|---|
| | $10^{-8}$ | $10^{-6}$ | $10^{-4}$ |
| S | −13 | 19 | 57 |
| Zn | 127 | 177 | 250 |
| SnS | 312 | 385 | 450 |
| ZnS | 531 | 640 | 800 |
| Sn | 682 | 807 | 997 |
| Cu | 727 | 857 | 1017 |

Figure 2A:
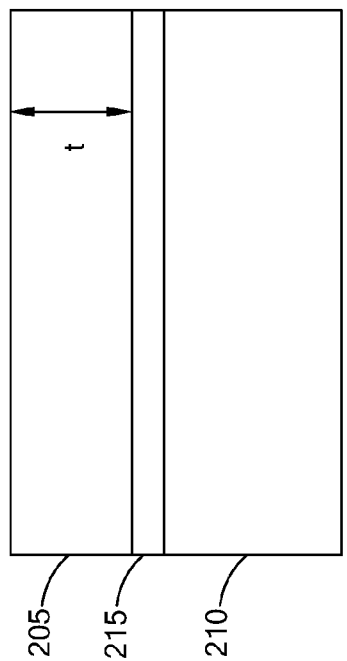
FIGS. 2A-2D provide a schematic illustration of the isopiestic method according to one embodiment, shown in cross-section.

Although an advantage of the method is compositional uniformity, the isopiestic approach may be used to produce a material comprising a through-thickness gradient. For example, a through-thickness gradient in the composition of the sample may be achieved by controlling the length of time that the equilibration is carried out for a particular solid sample. By concluding the equilibration after a specified time, it may be possible to limit the depth to which the equilibration has been achieved, thereby achieving a different composition in an upper portion of the solid sample compared a lower portion of the sample. By carrying out the equilibration process for different time durations and under different isopiestic conditions (e.g., different chamber and/or reservoir temperatures and/or different reservoir vapor pressures), a through-thickness gradient in the composition of the sample may thus be achieved. Referring to FIG. 2A, a film 205 having comprising N elements and having a first composition is deposited on a substrate 210. A diffusion barrier 215 is shown between the film 205 and the substrate 210. Since precise composition/stoichiometry and phase (crystal structure) control is difficult if not impossible to obtain uniformly over a large area of the as-deposited film, the above-described isopiestic method may be carried out to tune and/or increase the uniformity of the composition.

Figure 2B:
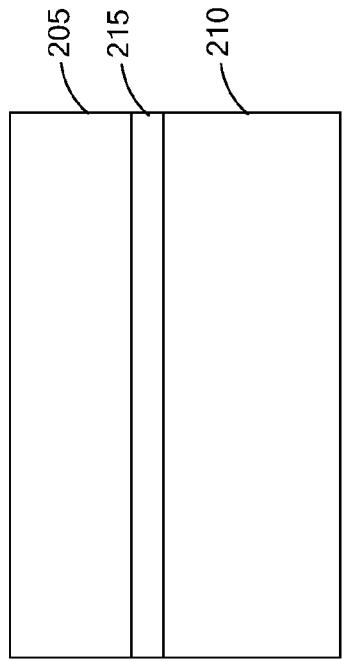
Figure 2D:
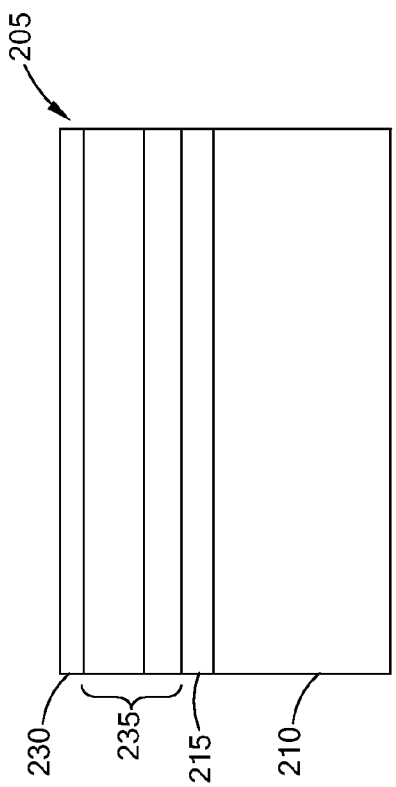
Figure 2C:
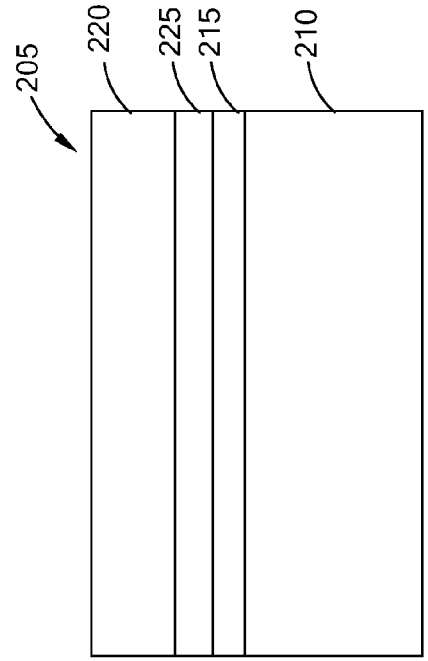

Referring to FIG. 2B, in a first step the entire thickness (t) of the film (the "solid sample") 205 is uniformly equilibrated under a first isopiestic condition to obtain a desired second composition uniformly over an entire area of the film 205. Next, referring to FIG. 2C, the film 205 is uniformly equilibrated under a second isopiestic condition for a suitable time duration in order to obtain a third desired composition uniformly over a specified depth 220 of the film (while the remainder 225 of the film is unchanged). Finally, referring to FIG. 2D, the solid sample 205 is exposed to a third isopiestic condition for a suitable time duration to obtain a fourth desired composition uniformly over a smaller depth 230 of the film, while the remainder 235 of the film 205 is unchanged. The process may be continued for a number of isopiestic equilibration steps in order to form a desired composition gradient through the thickness of the film.

Figure 3B:
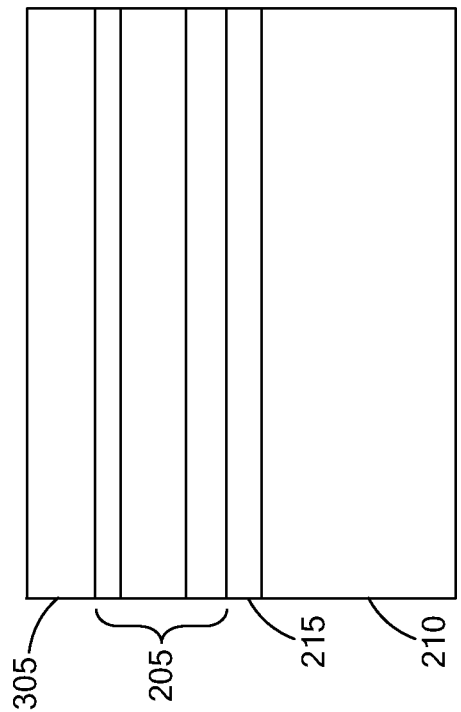
FIGS. 3A-3B provide a schematic illustration of the isopiestic method according to another embodiment, shown in cross-section.
Figure 3A:
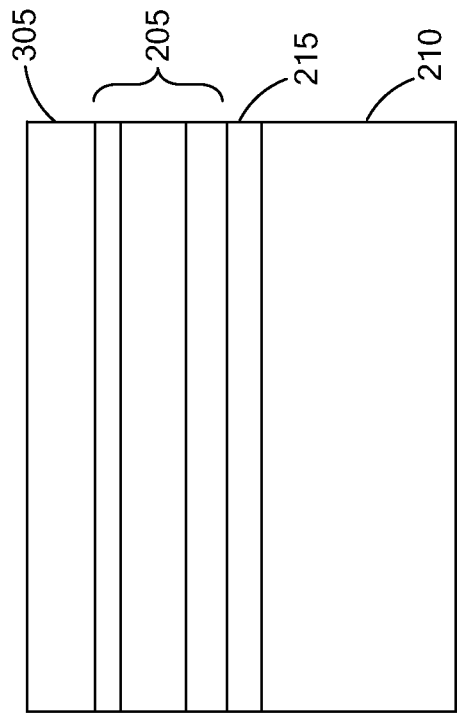

In another example, referring to FIGS. 3A-3B, additional material may be deposited on the solid sample 205 after equilibration to form a layer 305 having an initial layer composition, and then the layer 305 is heated to a desired temperature in the main chamber of the isopiestic system to carry out the isopiestic process, as described above. Thermodynamic equilibrium is achieved between each of the reservoirs and the layer in the main chamber, thereby changing the stoichiometry of the layer 305 to arrive at a second layer composition thereof, as indicated in FIG. 3B. This approach may be repeated multiple times to obtain a desired compositional gradient through the thickness of the solid sample.

Theoretical Considerations

The Gibbs free energy of a binary compound (AB) per mole is an algebraic sum of the individual chemical potentials $\mu(k)$ weighted by the mole fractions $X(k)$:

$$\Delta G(AB) = X(A) \cdot \Delta \overline{G}(A) + \Delta \overline{G}(B) \cdot X(B)$$

$$\Delta \mu(A) = \Delta \overline{G}(A); \Delta \mu(B) = \Delta \overline{G}(B)$$

To attain thermodynamic equilibrium with gas phase at constant temperature and external system pressure means:

$$\mu(A)^{solid} = \mu(A)^{gas}; \mu(B)^{solid} = \mu(B)^{gas}$$

The chemical potential of a component in the solid (e.g. $\mu(A)^{solid}$ or $\mu(B)^{solid}$) is related to its activity (e.g., $a(A)^{solid}$ or $a(B)^{solid}$). The activity of a component in the solid phase is directly obtained from the ratio of the partial vapor pressure of that component (e.g., p(A) or p(B)) over the solid AB relative to the absolute vapor pressure of the pure component (e.g., p°(A) or p°(B)) at the temperature T.

$$\mu(B) = \mu^o(B) + RT \ln a(B)$$

$$a(B) = \frac{p(B)}{p^o(B)}$$

Hence, controlling the partial vapor pressure of a component in the gas phase, e.g., taking an isopiestic approach, allows for control of the chemical potential of that component in the solid AB compound. The preceding equations for a binary compound AB including components (or elements) A and B can be extended to a multi-element compound including elements A, B . . . N. In a binary system at constant temperature and system pressure, only a single independent chemical potential exists because of the Gibbs-Duhem relation between the chemical potentials (e.g., see textbook by R. T. DeHoff, *Thermodynamics in Materials Science*, Second Edition, CRC Press, 2006); a quaternary system such as CZTS has three independent chemical potentials (the chemical potentials of Sn, Zn and S).

Figure 4:
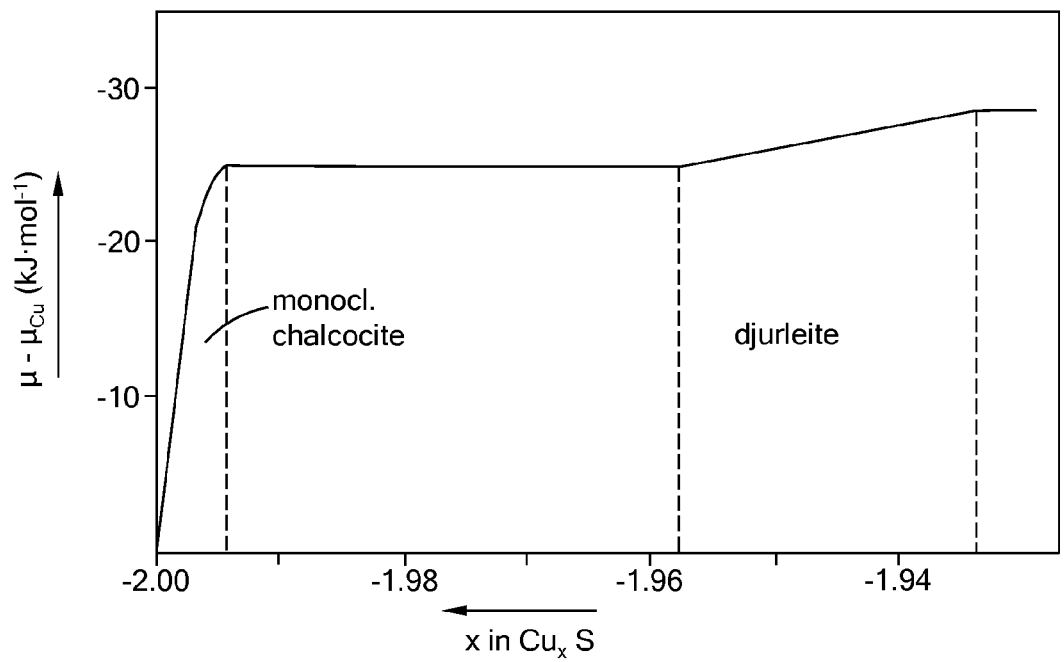
FIG. 4 is a graph showing the chemical potential of copper in $Cu_xS$ as a function of the stoichiometry x (2.00>x>1.93) at 20° C. (taken from Wagner and Wiemhofer, *J. Phys. Chem. Sol.*, 1983)
Figure 5:
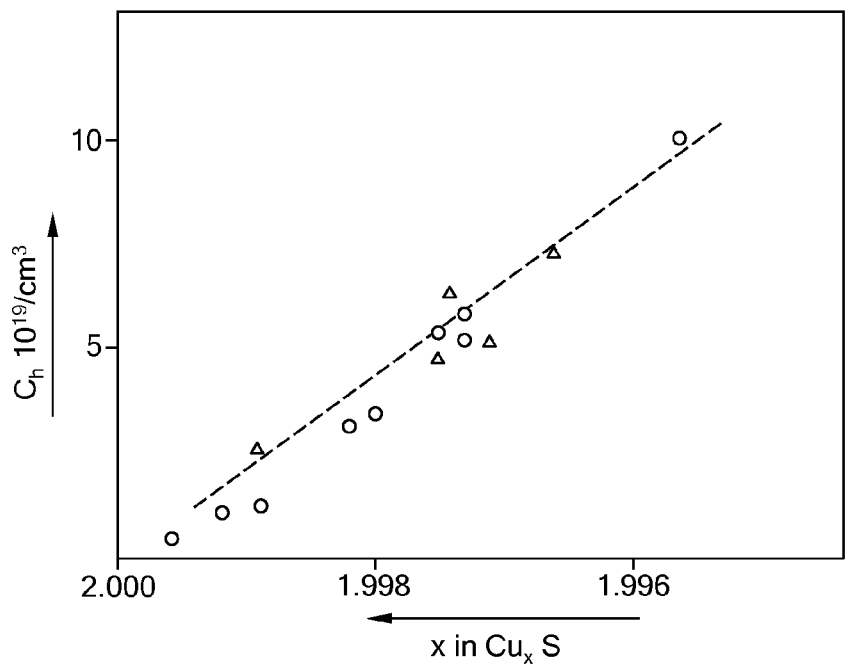
FIG. 5 is a graph showing hole concentration as a function of stoichiometry in $Cu_xS$ (taken from Wagner and Wiemhofer, *J. Phys. Chem. Sol.*, 1983).

Consider a binary sulfide compound such as the low-temperature, chalcocite phase of $Cu_2S$, a p-type semiconductor (~1.4 eV) where a small deficit in the stoichiometry is usually observed. This is commonly expressed by the stoichiometry variable x in $Cu_xS$. As seen in FIG. 4, a small variation in the stoichiometry of the monoclinic chalcocite phase (from 2 to about 1.995) leads to a very large change (in kJ/mole) in the chemical potential of Cu ($\mu_{Cu}$) relative to the pure Cu reference state. Between x=1.995 and about 1.958, there exists a two-phase equilibrium between the chalcocite and djurleite phases, and beyond that the djurleite phase becomes stable. The physical properties of such sulfide compounds are markedly influenced by changes in the intrinsic point defect concentrations that are caused by stoichiometry variations. In this case, an increase in the concentration of ionized copper vacancies leads to an increase in the hole concentration and hole conductivity, as illustrated in FIG. 5.

In $Cu_xS$, at equilibrium, the chemical potentials of the Cu and S components in the solid sample ($\mu_{Cu}$ and $\mu_S$) are equal to the corresponding chemical components of Cu and S in the surrounding gas phase. The chemical potentials in the gas phase are in turn directly related to their respective vapor pressures. In $Cu_xS$, it is the S component that is more volatile than Cu and hence has a much higher vapor pressure. Since there is only a single independent chemical potential in a binary solid compound at fixed temperature and pressure, controlling the chemical potential of one component (e.g., S) by equilibrating with a known vapor pressure of S in the gas phase may establish the chemical potential of the second component (Cu), and hence the overall composition or stoichiometry in the binary compound may be established. Accordingly, intrinsic physical properties in solid compounds such as sulfides can be controlled using this vapor phase equilibration technique, which may be referred to as an isopiestic technique. A similar approach to control the physical properties in CZTS would involve equilibration with Sn, S and Zn vapor species.

Although the present invention has been described with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of controlling stoichiometry in multicomponent materials, the method comprising:
   providing a solid sample comprising N elements and having a first composition in a main chamber connected to at most N−1 reservoirs, each of the reservoirs being configured to contain a vapor comprising one of the N elements, where N≥2;
   uniformly heating the solid sample to a first temperature in the main chamber;
   heating each of the reservoirs to a first reservoir temperature ($T_1, T_2 \ldots T_{N-1}$) sufficient to achieve a predetermined vapor pressure of the vapor contained therein;
   placing the reservoirs in gaseous communication with the main chamber;
   achieving thermodynamic equilibrium between the vapor of each of the reservoirs and the solid sample in the main chamber, thereby changing a stoichiometry of the solid sample to arrive at a second composition thereof.

2. The method of claim 1, further comprising, after achieving thermodynamic equilibrium and changing the stoichiometry of the solid sample to arrive at the second composition thereof, measuring one or more properties of the solid sample.

3. The method of claim 1, further comprising, after achieving thermodynamic equilibrium and changing the stoichiometry of the solid sample to arrive at the second composition thereof, determining the change in the stoichiometry of the solid sample.

4. The method of claim 3, wherein determining the change in stoichiometry of the solid sample comprises determining a weight change thereof.

5. The method of claim 3, further comprising, after determining the change in the stoichiometry of the solid sample, optimizing the stoichiometry of the solid sample by: uniformly heating the solid sample in the main chamber to a second temperature; heating each of the reservoirs to a second reservoir temperature ($t_1, t_2 \ldots t_{N-1}$); placing the reservoirs in gaseous communication with the main chamber; achieving thermodynamic equilibrium between each of the reservoirs and the solid sample in the main chamber, thereby changing the stoichiometry of the solid sample to arrive at a second tuned composition thereof.

6. The method of claim 5, further comprising, after achieving thermodynamic equilibrium and changing the stoichiometry of the solid sample to arrive at the second tuned composition thereof, determining the change in the stoichiometry and measuring one or more properties of the solid sample.

7. The method of claim 5, further comprising optimizing the stoichiometry of the solid sample multiple times to arrive at an optimal composition.

8. The method of claim 1, further comprising uniformly heating the solid sample in the main chamber to a second temperature; heating each of the reservoirs to a second reservoir temperature ($t_1, t_2 \ldots t_{N-1}$); and placing the reservoirs in gaseous communication with the main chamber for a time sufficient to achieve thermodynamic equilibrium and change the stoichiometry of the solid sample over a given depth thereof to arrive at a new composition over the given depth, thereby achieving a different composition in an upper portion of the solid sample compared to a lower portion of the solid sample.

9. The method of claim 8 carried out multiple times to arrive at a composition gradient as a function of depth in the solid sample.

10. The method of claim 1, wherein each of the first reservoir temperatures ($T_1, T_2 \ldots T_{N-1}$) is the same as the first temperature, the heating of the solid sample and the heating of the N−1 reservoirs being carried out under isothermal conditions.

11. The method of claim 1, wherein at least one of the first reservoir temperatures ($T_1, T_2 \ldots T_{N-1}$) is different from the first temperature, the heating of the solid sample and the heating of the N−1 reservoirs being carried out under non-isothermal conditions.

12. The method of claim 1, further comprising:
providing one or more additional solid samples each comprising N elements and having a given sample composition in the main chamber connected to the reservoirs, the main chamber thereby containing a plurality of solid samples;
uniformly heating the plurality of solid samples to the first temperature in the main chamber; and
achieving thermodynamic equilibrium between the vapor of each of the reservoirs and the plurality of solid samples, thereby changing a stoichiometry of the each of the solid samples in the main chamber.

13. The method of claim 1, wherein providing the solid sample comprises forming the solid sample on a substrate by a deposition process.

14. The method of claim 13, wherein the deposition process is carried out prior to achieving thermal equilibrium.

15. The method of claim 13, wherein the deposition process is carried out simultaneously with achieving thermal equilibrium.

16. The method of claim 1, further comprising forming a compositional gradient by, after achieving thermodynamic equilibrium, depositing additional material on the solid sample to form a layer comprising a layer composition, and further comprising:
uniformly heating the solid sample including the layer to a desired temperature in the main chamber;
heating each of the reservoirs to a given reservoir temperature sufficient to achieve a given vapor pressure of the vapor contained therein;
placing the reservoirs in gaseous communication with the main chamber; and
achieving thermodynamic equilibrium between each of the reservoirs and the layer in the main chamber, thereby changing a stoichiometry of the layer.

17. The method of claim 1, wherein the solid sample is a thin film comprising a thickness of about 5 microns or less.

18. The method of claim 1, wherein N≥4, the solid sample comprising at least four elements.

19. The method of claim 1, wherein the N elements include sulfur, copper, tin and zinc.

20. An apparatus for controlling stoichiometry in multi-component compounds, the apparatus comprising:
a main chamber defining an enclosed space therein and comprising a heat source for uniform heating of a solid sample comprising N elements, where N≥2; and
at most N−1 temperature-controlled reservoirs connected to the main chamber, each of the temperature-controlled reservoirs being configured to contain a vapor comprising one of the N elements at a desired vapor pressure.

21. The apparatus of claim 17, wherein the main chamber further comprises a microbalance for in-situ gravimetric monitoring.

22. The apparatus of claim 20 including one or more viewing windows for line-of-sight access to the solid sample for conducting in-situ measurements.

23. The apparatus of claim 20, wherein the main chamber further comprises a sample holder configured to hold a plurality of solid samples in the enclosed space.

\* \* \* \* \*